(12) United States Patent
Hu

(10) Patent No.: US 9,711,444 B2
(45) Date of Patent: Jul. 18, 2017

(54) PACKAGING MODULE AND SUBSTRATE STRUCTURE THEREOF

(71) Applicant: PHOENIX PIONEER TECHNOLOGY CO., LTD., Hsinchu County (TW)

(72) Inventor: Wen-Hung Hu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/231,931

(22) Filed: Aug. 9, 2016

(65) Prior Publication Data
US 2017/0047279 A1   Feb. 16, 2017

(30) Foreign Application Priority Data

Aug. 14, 2015 (CN) .......................... 2015 1 0500016

(51) Int. Cl.
| | |
|---|---|
| H01L 21/48 | (2006.01) |
| H01L 21/56 | (2006.01) |
| H01L 23/31 | (2006.01) |
| H01L 23/498 | (2006.01) |

(52) U.S. Cl.
CPC ...... *H01L 23/49838* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/49811* (2013.01); *H01L 23/49822* (2013.01); *H01L 23/49827* (2013.01); *H01L 2224/16225* (2013.01); *H01L 2924/15311* (2013.01); *H01L 2924/19105* (2013.01)

(58) Field of Classification Search
CPC ... H01L 23/12; H01L 23/49; H01L 23/49811; H01L 23/49833; H01L 23/538; H01L 23/481; H01L 23/3121; H01L 23/3114; H01L 2224/32225; H01L 21/486; H01L 23/49827; H01L 23/49838; H01L 23/562; H01L 2924/00014; H01L 2924/15311; H01L 21/6835
See application file for complete search history.

(56) References Cited

U.S. PATENT DOCUMENTS 9,048,233 B2 * 6/2015 Wu .................... H01L 23/49827
2016/0315041 A1 * 10/2016 Yen .................... H01L 23/49838

* cited by examiner

*Primary Examiner* — Jasmine Clark
(74) *Attorney, Agent, or Firm* — Amin, Turocy & Watson LLP

(57) ABSTRACT

A substrate structure is provided, including: a circuit board having a plurality of wiring layers; a first circuit layer; a plurality of conductive posts disposed on the first circuit layer; a first insulating layer encapsulating the circuit board, the first circuit layer and the conductive posts; and a second circuit layer formed on the first insulating layer and electrically connected to the wiring layers with the second circuit layer electrically connected to the first circuit layer through the conductive posts. According to the present disclosure, fine-pitch circuits are formed in the circuit board, and thus only the circuit board needs a high-cost insulating material, thereby allowing the first insulating layer to be made of a low-cost material to reduce the fabrication cost.

15 Claims, 3 Drawing Sheets

PACKAGING MODULE AND SUBSTRATE STRUCTURE THEREOF

BACKGROUND

1. Technical Field

The present disclosure relates to substrate structures, and, more particularly, to a substrate structure for disposing electronic elements thereon.

2. Description of Related Art

Along with the rapid development of electronic industries, electronic products are developed toward the trend of miniaturization and multi-function. Accordingly, there have been developed various kinds of packaging modules.

FIG. 1 is a schematic cross-sectional view of a conventional packaging module 1. The packaging module 1 has a substrate structure 1', an active element 8a and a passive element 8b disposed on the substrate structure 1', and an encapsulant 9 encapsulating the active element 8a and the passive element 8b.

The substrate structure 1' has a first circuit layer 11, a plurality of first conductive posts 100 disposed on the first circuit layer 11, a first insulating layer 13 encapsulating the first circuit layer 11 and the first conductive posts 100, a second circuit layer 12 formed on the first insulating layer 13, a plurality of second conductive posts 15 disposed on the second circuit layer 12, a second insulating layer 14 encapsulating the second circuit layer 12 and the second conductive posts 15, a third circuit layer 16 formed on the second insulating layer 14, a plurality of conductive bumps 160 disposed on the third circuit layer 16, and an insulating protection layer 17 formed on the second insulating layer 14 and the third circuit layer 16. The conductive bumps 160 are exposed from the insulating protection layer 17, and a plurality of conductive elements 18 are disposed on the conductive bumps 160.

The active element 8a and the passive element 8b are electrically connected to the first circuit layer 11 through a plurality of conductive elements 19.

In the conventional substrate structure 1', the first circuit layer 11, the first conductive posts 100 and the first insulating layer 13 constitute a wiring portion 1a; the second circuit layer 12, the second conductive posts 15 and the second insulating layer 14 constitute a wiring portion 1b; and the third circuit layer 16, the conductive bumps 160 and the insulating protection layer 17 constitute a wiring portion 1c.

Generally, conductive through holes are formed for electrically connecting upper and lower circuit layers of a substrate. In the conventional substrate structure 1', the first circuit layer 11 and the third circuit layer 16 are upper and lower circuit layers of the substrate structure 1', respectively. As such, a portion of the first conductive posts 100 and the second conductive posts 15 can be viewed as conductive through holes 10 of the substrate structure 1'.

The substrate structure 1' is a substrate having a high density of circuits and mainly applied in electronic products having high-end chips. As electronic products become smaller, more functional and faster and have higher storage capacity, high-cost high-end materials (for example, an insulating material having extremely small sized particles) are used to fabricate multi-layer circuit structures, for example, the three wiring portions 1a, 1b and 1c of FIG. 1, so as to form the substrate structure 1' having a high density of circuits. In particular, the conductive traces of the substrate structure 1' that are electrically connected to the active element 8a are fabricated through a fine-pitch circuit process and the fine-pitch circuit area A of the substrate structure 1' that is used for disposing the active element 8a is made of a high-end material. That is, the particle size of the first insulating layer 13 and the second insulating layer 14 is extremely small, for example, less than 5 um.

However, since the non-fine-pitch circuit area B of the substrate structure 1' that is used for disposing the passive element 8b is also made of a high-end material corresponding to the fine-pitch circuit area A, the overall fabrication cost of the substrate structure 1' is increased.

Further, the substrate structure 1' needs a plurality of wiring portions 1a, 1b and 1c for bonding with high-end chips, thus increasing the overall thickness of the substrate structure 1'.

Also, when the wiring portions 1a and 1b are stacked and aligned to form the conductive through holes 10, an alignment error likely occurs between the first conductive posts 100 and the second conductive posts 15, thereby adversely affecting the quality of the conductive through holes 10.

Therefore, how to overcome the above-described drawbacks has become critical.

SUMMARY

In view of the above-described drawbacks, the present disclosure provides a substrate structure, which comprises: a first insulating layer having a first surface and a second surface opposite to the first surface; a first circuit layer embedded in the first insulating layer and exposed from the first surface of the first insulating layer; a plurality of conductive posts disposed in the first insulating layer and electrically connected to the first circuit layer; a circuit board embedded in the first insulating layer, communicating with the first surface and the second surface of the first insulating layer, and having a plurality of wiring layers with a portion of the wiring layers exposed from the first surface and the second surface of the first insulating layer; and a second circuit layer formed on the circuit board and the second surface of the first insulating layer and electrically connected to the wiring layers with the first circuit layer electrically connected to the second circuit layer through the conductive posts.

In an embodiment, the wiring layers of the circuit board can be embedded in a second insulating layer. The second insulating layer and the first insulating layer can be made of different materials.

In an embodiment, the wiring layers can comprise a plurality of conductive traces and a plurality of conductive vias electrically connected to the conductive traces.

In an embodiment, the substrate structure can further comprise a plurality of conductive bumps disposed on the second circuit layer. In an embodiment, an insulating protection layer is formed on the circuit board and the second surface of the first insulating layer and encapsulates the second circuit layer with the conductive bumps exposed from the insulating protection layer. In an embodiment, a plurality of conductive elements are disposed on the conductive bumps.

In an embodiment, the substrate structure can further comprise a plurality of conductive elements disposed on the first surface of the first insulating layer or the circuit board.

The present disclosure further provides a packaging module, which comprises: the above-described substrate structure; and at least one first electronic element disposed on a side of the circuit board opposite to the first surface of the first insulating layer and electrically connected to the wiring layers.

In an embodiment, the packaging module can further comprise a plurality of conductive elements disposed on the circuit board and electrically connected to the wiring layers and the first electronic element.

In an embodiment, the packaging module can further comprise at least one second electronic element disposed on the first surface of the first insulating layer and electrically connected to the first circuit layer.

In an embodiment, the packaging module can further comprise a plurality of conductive elements disposed on the first surface of the first insulating layer and electrically connected to the first circuit layer and the second electronic element.

In an embodiment, the packaging module can further comprise an encapsulant formed on the first surface of the first insulating layer and encapsulating the first electronic element and the second electronic element.

According to the present disclosure, a circuit board is fabricated first and then introduced into a general substrate process. As such, a high-cost insulating material is only applied in the circuit board, and the first insulating layer can be made of a low-cost material. Compared with the prior art, the substrate structure according to the present disclosure has a lower fabrication cost.

Further, fine-pitch circuits are formed in the circuit board, and only a second circuit layer is formed on the first insulating layer, thereby reducing the number of layers of the wiring portion so as to reduce the thickness of the overall structure.

Furthermore, the conductive posts in the first insulating layer can be viewed as conductive through holes. Since the conductive through holes are integrally formed with the substrate structure, the present disclosure dispenses with an alignment process and hence overcomes the conventional drawbacks caused by an alignment error.

DETAILED DESCRIPTION

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2F are schematic cross-sectional views showing a method for fabricating a packaging module 3 and a substrate structure 2 thereof according to the present disclosure.

Figure 2A:
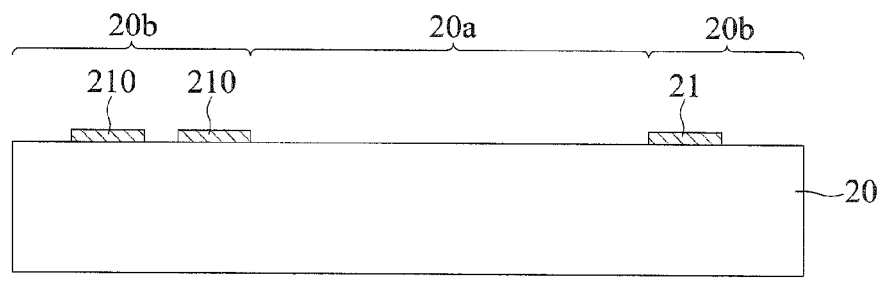
FIGS. 2A to 2F are schematic cross-sectional views showing a method for fabricating a packaging module and a substrate structure thereof according to the present disclosure, wherein FIG. 2C' is a partially enlarged view of FIG. 2C.

Referring to FIG. 2A, a first circuit layer 21 is formed on a carrier 20 through a patterning process.

In an embodiment, the carrier 20 is a substrate such as a copper foil substrate.

Further, a main area 20a and an auxiliary area 20b adjacent to the main area 20a are defined on a surface of the carrier 20.

The first circuit layer 21 is formed on the auxiliary area 20b of the carrier 20, and has a plurality of conductive pads 210.

The patterning process includes formation of a photoresist layer, exposure and development of the photoresist layer, copper electroplating, removal of the photoresist layer and so on.

Figure 2B:
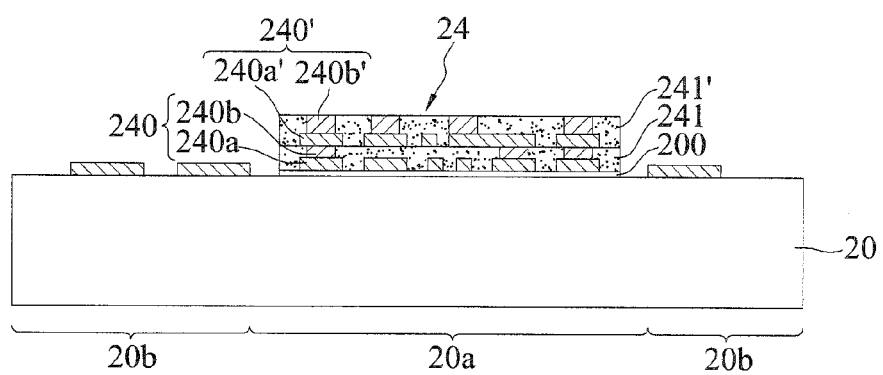

Referring to FIG. 2B, a circuit board 24 is disposed on the main area 20a of the carrier 20 through an adhesive layer 200. In an embodiment, the circuit board 24 is a semi-finished fine-pitch circuit board.

In an embodiment, the circuit board 24 has two wiring layers 240, 240', and two second insulating layers 241, 241' encapsulating the two wiring layers 240, 240', respectively. The second insulating layers 241, 241' are made of the same material. The wiring layers 240, 240' have a plurality of conductive traces 240a, 240a' and a plurality of conductive vias 240b, 240b' electrically connected to the conductive traces 240a, 240a'. Some of the conductive vias 240b provides electrical connection between the two layers of the conductive traces 240a, 240a'.

In an embodiment, the conductive traces 240a of the wiring layer 240 are exposed from a lower side of the second insulating layer 241, and a portion of the conductive vias 240b' is exposed from an upper side of the second insulating layer 241'. In another embodiment, the portion of the conductive vias 240b' is not exposed from the upper side of the second insulating layer 241'.

The number of the wiring layers of the circuit board 24 can be varied according to the practical need.

According to the present disclosure, the semi-finished fine-pitch circuit board 24 is fabricated in a single process so as to reduce consumption of the fine-pitch circuit material and hence reduce the fabrication cost.

Figure 2C:
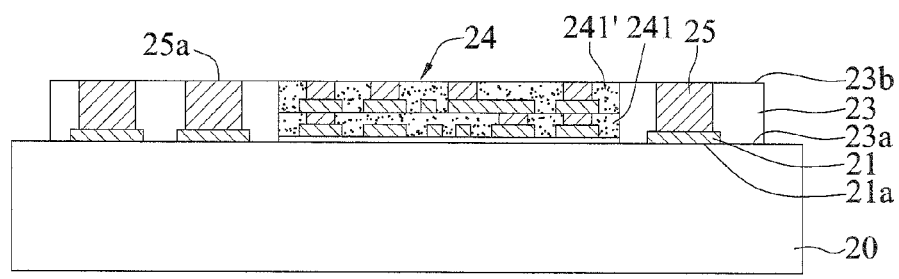
Figure 2C:
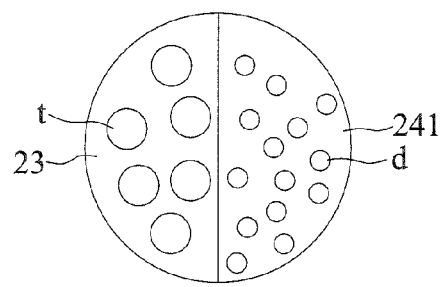

Referring to FIG. 2C, a plurality of conductive posts 25 are disposed on the first circuit layer 21 through a patterning process, and a first insulating layer 23 is then formed on the carrier 20 to encapsulate the first circuit layer 21, the conductive posts 25 and the circuit board 24. The first insulating layer 23 has a first surface 23a bonded to the carrier 20 and a second surface 23b opposite to the first surface 23a.

In an embodiment, the patterning process includes formation of a photoresist layer, exposure and development of the photoresist layer, copper electroplating, removal of the photoresist layer and so on. In an embodiment, the conductive posts 25 are copper posts.

A surface 21a of the first circuit layer 21 is flush with the first surface 23a of the first insulating layer 23, and one end surface 25a of the conductive posts 25 is exposed from the second surface 23b of the first insulating layer 23.

The first insulating layer 23 is formed by laminating or molding, and then planarized to cause the end surface 25a of the conductive posts 25 to be flush with the second surface 23b of the first insulating layer 23.

The first insulating layer 23 is made of a molding compound or a dielectric material, such as an epoxy resin, polyimide or other photosensitive or non-photosensitive organic resin. The first insulating layer 23 and the second insulating layers 241, 241' are made of different materials. In an embodiment, referring to FIG. 2C', the particle size d of the second insulating layer 241 is significantly less than the particle size t of the first insulating layer 23.

In an embodiment, the portion of the conductive vias 240b', if not exposed from the second insulating layer 241' in the process of FIG. 2B, can be exposed from the second insulating layer 241' through planarization of the first insulating layer 23.

Figure 2D:
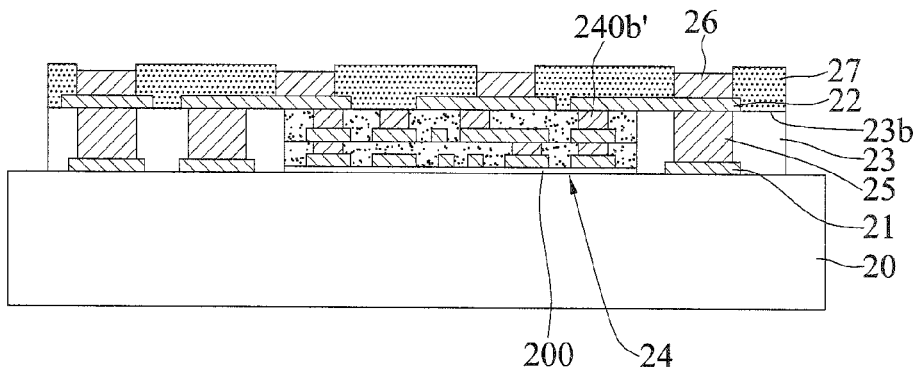

Referring to FIG. 2D, a second circuit layer 22 is formed on the circuit board 24 and the second surface 23b of the first insulating layer 23 through a patterning process. The second circuit layer 22 is electrically connected to the conductive vias 240b' of the wiring layer 240' and further electrically connected to the first circuit layer 21 through the conductive posts 25. A plurality of conductive bumps 26 are disposed on the second circuit layer 22 through a patterning process. An insulating protection layer 27 is formed on the circuit board 24 and the second surface 23b of the first insulating layer 23 to encapsulate the second circuit layer 22. The conductive bumps 26 are exposed from the insulating protection layer 27.

In an embodiment, the second circuit layer 22 is directly connected to the conductive vias 240b', the conductive posts 25 and the conductive bumps 26.

In an embodiment, the insulating protection layer 27 is formed by laminating or molding. The insulating protection layer 27 is made of a molding compound, a dielectric material, such as an epoxy resin, polyimide, a photosensitive or non-photosensitive organic resin, or a solder mask layer.

The insulating protection layer 27 is first formed to cover the second circuit layer 22 and the conductive bumps 26, and then planarized. If needed, top surfaces of the conductive bumps 26 can be etched. As such, the top surfaces of the conductive bumps 26 are exposed from the surface of the insulating protection layer 27. The top surfaces of the conductive bumps 26 are, or are not flush with the surface of the insulating protection layer 27. Alternatively, the insulating protection layer 27 is first formed to cover the second circuit layer 22 and the conductive bumps 26, and then a plurality of openings are formed in the insulating protection layer 27 to expose the conductive bumps 26.

Figure 2E:
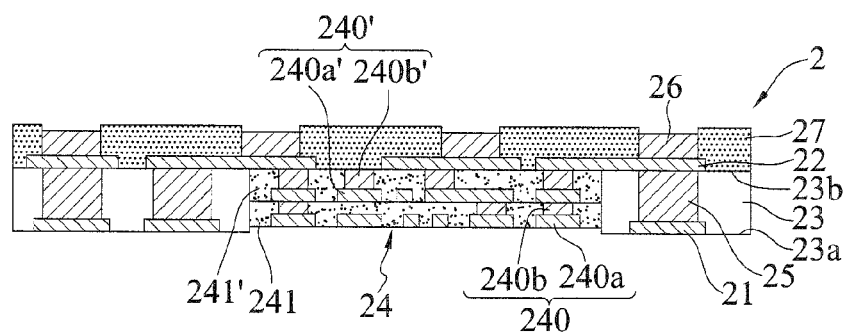

Referring to FIG. 2E, the carrier 20 and the adhesive layer 200 are removed to expose the first circuit layer 21 and the conductive traces 240a of the wiring layer 240.

In an embodiment, the exposed surface of the circuit board 24 is lower than the first surface 23a of the first insulating layer 23. In other embodiments, the exposed surface of the circuit board 24 can be flush with the first surface 23a of the first insulating layer 23.

According to the present disclosure, the semi-finished fine-pitch circuit board 24 is introduced into a standard substrate process, and then a built-up process is performed to form an asymmetric structure. In an embodiment, the circuit board 24 has two wiring layers 240, 240', and the first insulating layer 23 has only one circuit structure (i.e., the first circuit layer 21 and the conductive posts 25) formed therein. That is, a plurality of wiring layers 240, 240' correspond to one layer of circuit structure.

In an embodiment, fine-pitch circuits are formed in the circuit board 24, and the number of the wiring layers 240, 240' can be designed according to the practical need. Accordingly, the number of the circuit layers in the first insulating layer 23 can be reduced. Compared with the prior art, the present disclosure reduces the number of layers of the wiring portion of the substrate structure 2 so as to reduce the thickness of the overall structure.

Furthermore, the wiring layers 240, 240' of the circuit board 24 already meet the requirement of the fine-pitch circuits, and therefore only two circuit layers, i.e., the first circuit layer 21 and the second circuit layer 22, are formed on the upper and lower sides of the first insulating layer 23. As such, a portion of the conductive posts 25 can be viewed as conductive through holes. Since the conductive through holes are integrally formed with the substrate structure 2, the present disclosure dispenses with an alignment process and hence overcomes the conventional drawbacks caused by an alignment error.

Figure 2F:
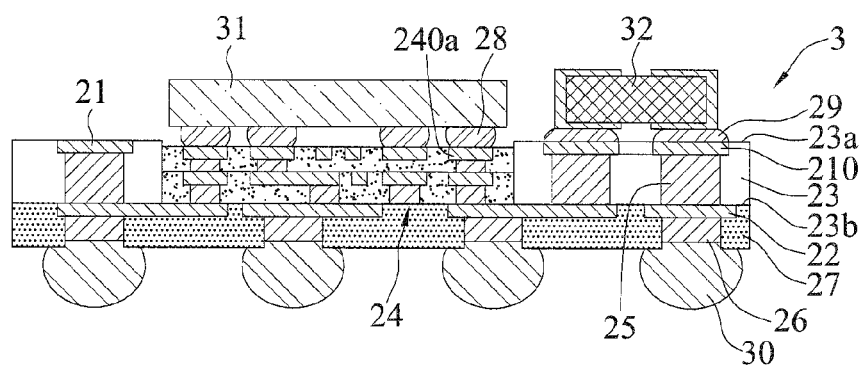

Referring to FIG. 2F, a plurality of conductive elements 28, 29 are disposed on the first surface 23a of the first insulating layer 23 for bonding with electronic elements.

In an embodiment, the conductive elements 28 are disposed on the circuit board 24 for electrically connecting the conductive traces 240a of the wiring layer 240 and a first electronic element 31.

The conductive elements 29 are disposed on the conductive pads 210 of the first circuit layer 21 for electrically connecting the first circuit layer 21 and a second electronic element 32.

Further, a plurality of conductive elements 30 are disposed on the insulating protection layer 27 and electrically connected to the conductive bumps 26. An electronic device such as a circuit board (not shown) can be further disposed on the conductive elements 30.

In an embodiment, the conductive elements 28, 29, 30 are solder balls, solder bumps or copper bumps. The first electronic element 31 is an active element such as a semiconductor chip, and the second electronic element 32 is a passive element, such as a capacitor, an inductor or a resistor.

Figure 1:
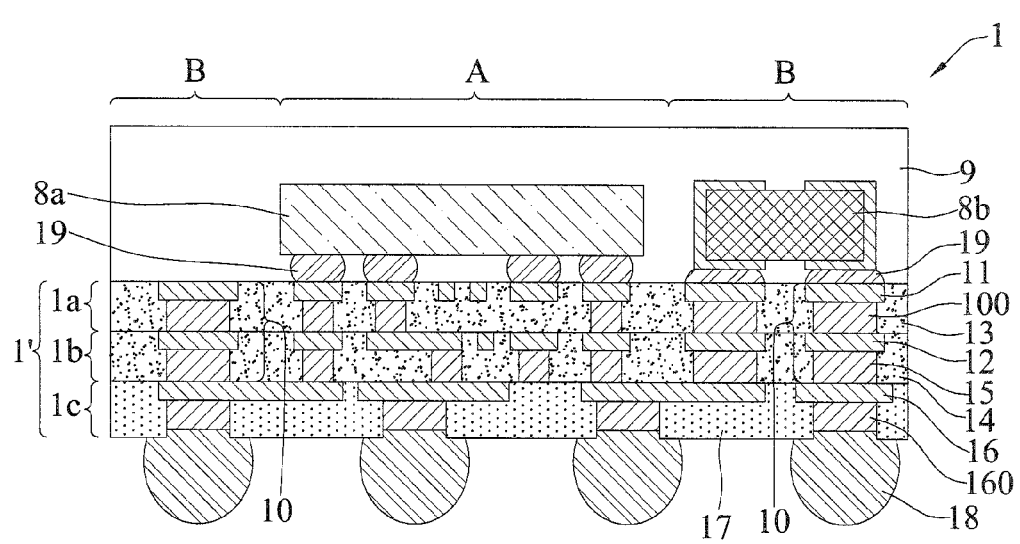
FIG. 1 is a schematic cross-sectional view of a conventional packaging module.

Subsequently, an encapsulant similar to the encapsulant 9 of FIG. 1 can be formed on the first surface 23a of the first insulating layer 23 to encapsulate the first electronic element 31 and the second electronic element 32.

According to the present disclosure, a circuit board 24 is fabricated first, and then introduced into a general substrate process. That is, high-end processes, such as fabrication of the circuit board 24 and fine-pitch circuits electrically connected to high-end chips, and low-end processes, such as fabrication of built-up circuits electrically connected to passive elements, are fabricated separately before formation of the finished substrate structure 2.

Further, the high-cost second insulating layer 241 is only applied in the circuit board 24, and the first insulating layer 23 is made of a low-cost material. That is, the non-fine-pitch circuit area for disposing the passive element (i.e., the second electronic element 32) does not need to be made of a high-end material corresponding to the fine-pitch circuit area (i.e., the circuit board 24), thus reducing the fabrication cost of the substrate structure 2.

The above-described descriptions of the detailed embodiments are only to illustrate the exemplary implementation according to the present disclosure, and it is not to limit the scope of the present disclosure. Accordingly, all modifications and variations completed by those with ordinary skill in the art should fall within the scope of present disclosure defined by the appended claims.

What is claimed is:
1. A substrate structure, comprising:
   a first insulating layer having a first surface and a second surface opposite to the first surface;
   a first circuit layer embedded in the first insulating layer and exposed from the first surface of the first insulating layer;
   a plurality of conductive posts disposed in the first insulating layer and electrically connected to the first circuit layer;

a circuit board embedded in the first insulating layer, communicating with the first surface and the second surface of the first insulating layer, and having a plurality of wiring layers with a portion of the wiring layers exposed from the first surface and the second surface of the first insulating layer; and a second circuit layer formed on the circuit board and the second surface of the first insulating layer and electrically connected to the wiring layers, wherein the first circuit layer is electrically connected to the second circuit layer through the conductive posts.

2. The substrate structure of claim 1, wherein the circuit board comprises a second insulating layer embedded with the wiring layers.

3. The substrate structure of claim 2, wherein the second insulating layer and the first insulating layer are made of different materials.

4. The substrate structure of claim 1, wherein the wiring layers comprise a plurality of conductive traces and a plurality of conductive vias electrically connected to the conductive traces.

5. The substrate structure of claim 1, further comprising a plurality of conductive bumps disposed on the second circuit layer.

6. The substrate structure of claim 5, further comprising an insulating protection layer formed on the circuit board and the second surface of the first insulating layer.

7. The substrate structure of claim 6, wherein the insulating protection layer encapsulates the second circuit layer with the conductive bumps exposed from the insulating protection layer.

8. The substrate structure of claim 5, further comprising a plurality of conductive elements disposed on the conductive bumps.

9. The substrate structure of claim 1, further comprising a plurality of conductive elements disposed on the first surface of the first insulating layer or the circuit board.

10. A packaging module, comprising:

the substrate structure of claim 1; and at least one first electronic element disposed on a side of the circuit board corresponding to the first surface of the first insulating layer and electrically connected to the wiring layers.

11. The packaging module of claim 10, further comprising a plurality of conductive elements disposed on the circuit board and electrically connected to the wiring layers and the first electronic element.

12. The packaging module of claim 10, further comprising at least one second electronic element disposed on the first surface of the first insulating layer and electrically connected to the first circuit layer.

13. The packaging module of claim 12, further comprising a plurality of conductive elements disposed on the first surface of the first insulating layer and electrically connected to the first circuit layer and the second electronic element.

14. The packaging module of claim 10, further comprising an encapsulant formed on the first surface of the first insulating layer.

15. The packaging module of claim 14, wherein the encapsulant encapsulates at least one of the first electronic element and the second electronic element.

* * * * *